(12) United States Patent
Retuta et al.

(10) Patent No.: US 7,476,569 B2
(45) Date of Patent: Jan. 13, 2009

(54) LEADFRAME ENHANCEMENT AND METHOD OF PRODUCING A MULTI-ROW SEMICONDUCTOR PACKAGE

(75) Inventors: Danny Vallejo Retuta, Singapore (SG); Hien Boon Tan, Singapore (SG); Susanto Tanary, Singapore (SG); Anthony Yi Sheng Sun, Singapore (SG); Soon Huat James Tan, Singapore (SG)

(73) Assignee: United Test and Assembly Center Ltd., Singapore (SG)

( * ) Notice: Subject to any disclaimer, the term of this patent is extended or adjusted under 35 U.S.C. 154(b) by 0 days.

(21) Appl. No.: 12/113,968

(22) Filed: May 2, 2008

(65) Prior Publication Data

US 2008/0199985 A1 Aug. 21, 2008

Related U.S. Application Data

(62) Division of application No. 11/406,357, filed on Apr. 19, 2006, now Pat. No. 7,375,416.

(51) Int. Cl.
*H01L 23/48* (2006.01)

(52) U.S. Cl. .................................. 438/113; 438/124
(58) Field of Classification Search ................ 438/113, 438/124, 123
See application file for complete search history.

(56) References Cited

U.S. PATENT DOCUMENTS

| 5,864,173 | A | * | 1/1999 | Fogelson ............ 257/666 |
| 6,326,687 | B1 | | 12/2001 | Corisis |
| 6,943,450 | B2 | | 9/2005 | Fee et al. |

* cited by examiner

*Primary Examiner*—Roy K Potter
(74) *Attorney, Agent, or Firm*—Sughrue Mion, PLLC

(57) ABSTRACT

A semiconductor package includes a plurality of first leads, each with a top outer portion removed from the lead and an outer end, and a plurality of second leads, each with a bottom outer portion removed from the lead and an outer end. The first and second leads alternate with each other along an edge of the package. Also, the outer ends of the first leads form a first row along the edge of the package and the outer ends of the second leads form a second row along the edge of the package. In one embodiment, the first and second rows are parallel to each other and an encapsulant covers at least a portion of the first and second leads.

7 Claims, 15 Drawing Sheets

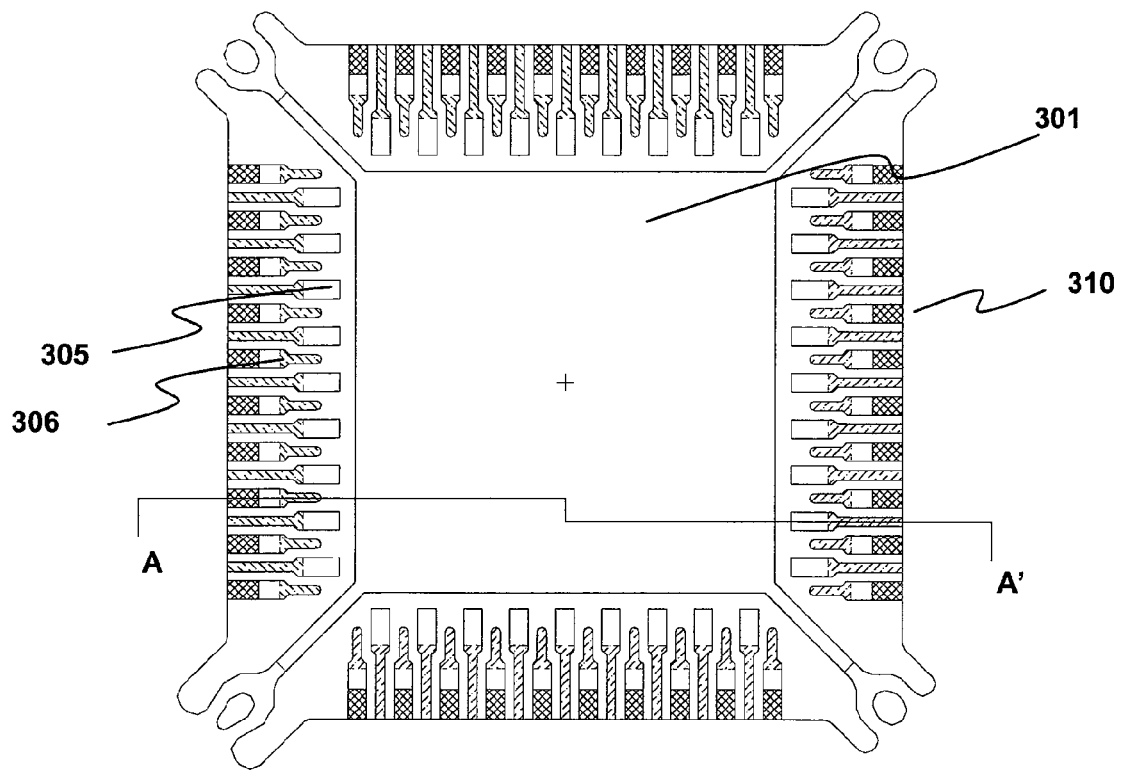
▓ – Partially etched on top side
▨ – Partially etched on bottom side
Figure 5
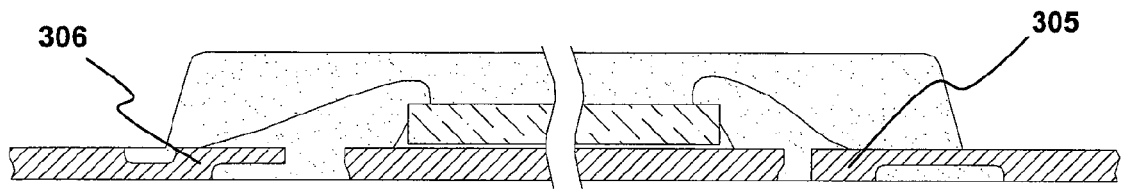
Figure 5a. Punch Singulated

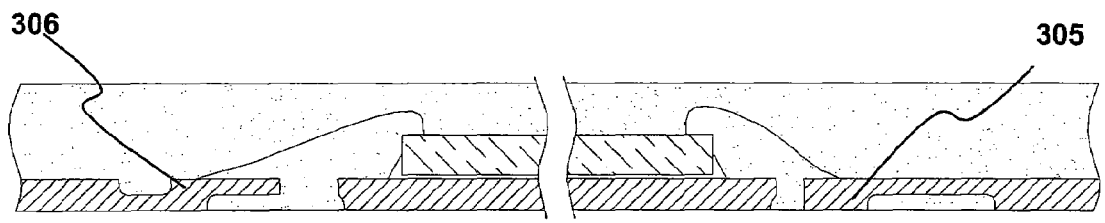
Figure 5b. Sawn Type
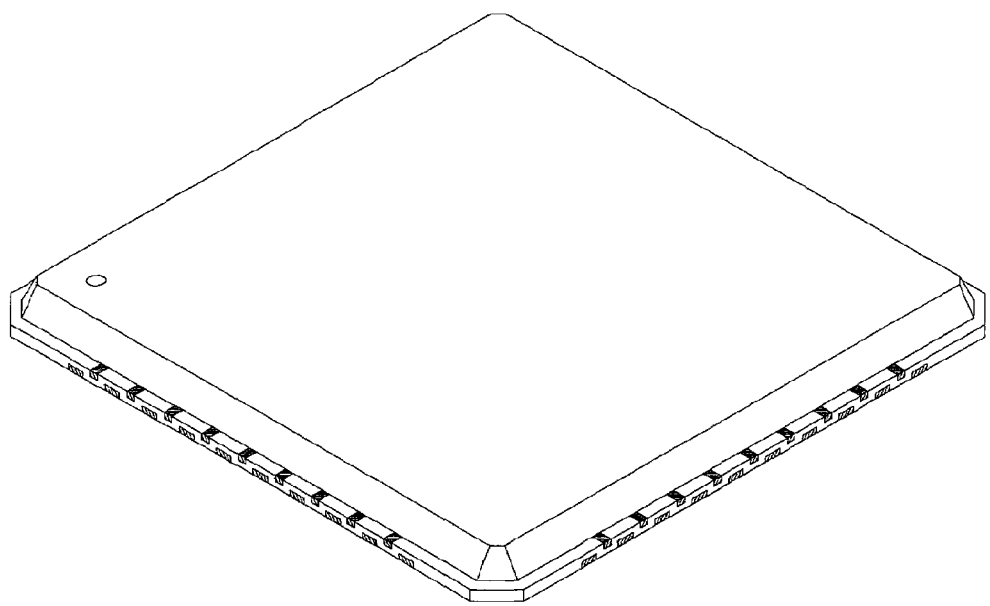
Figure 6

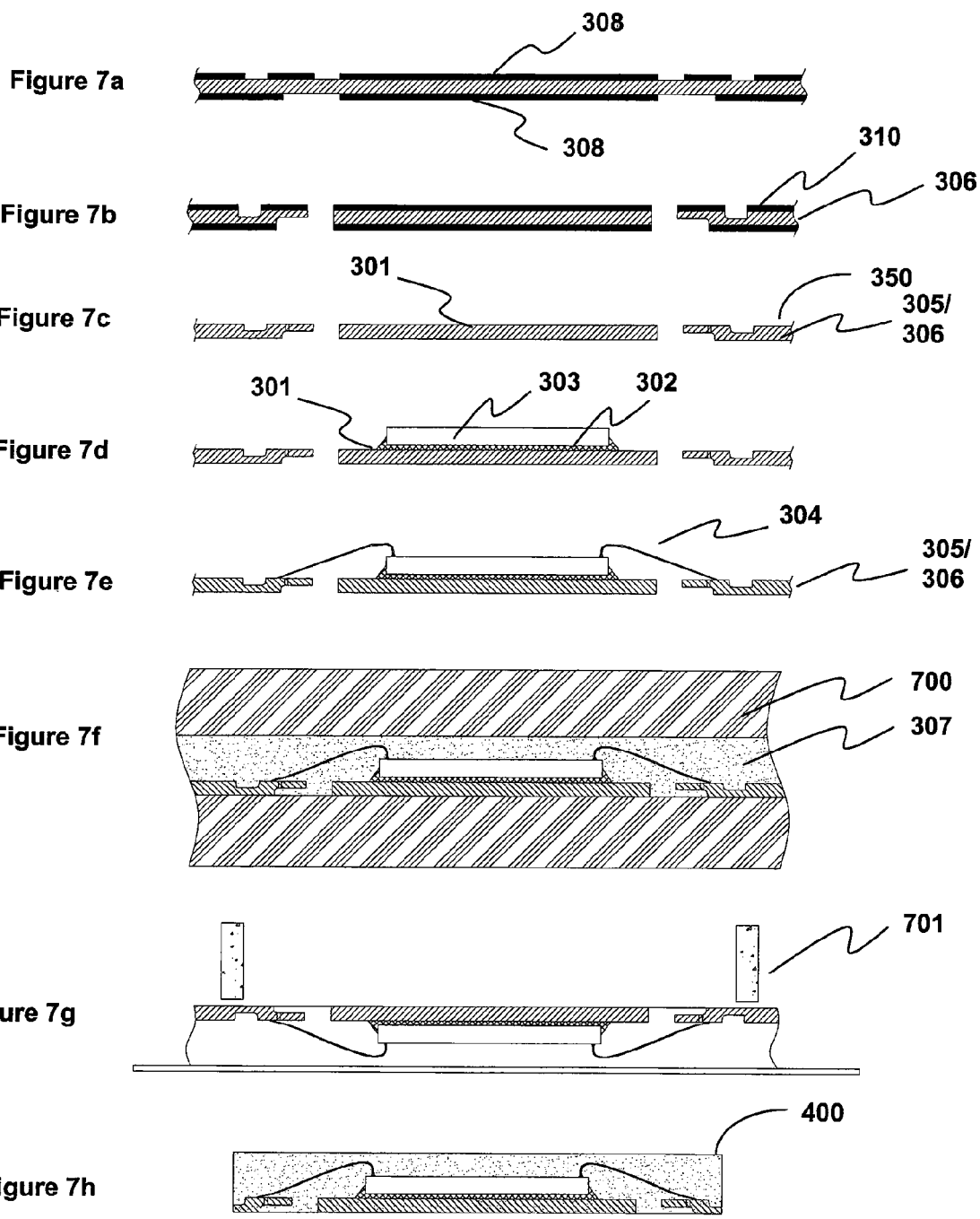

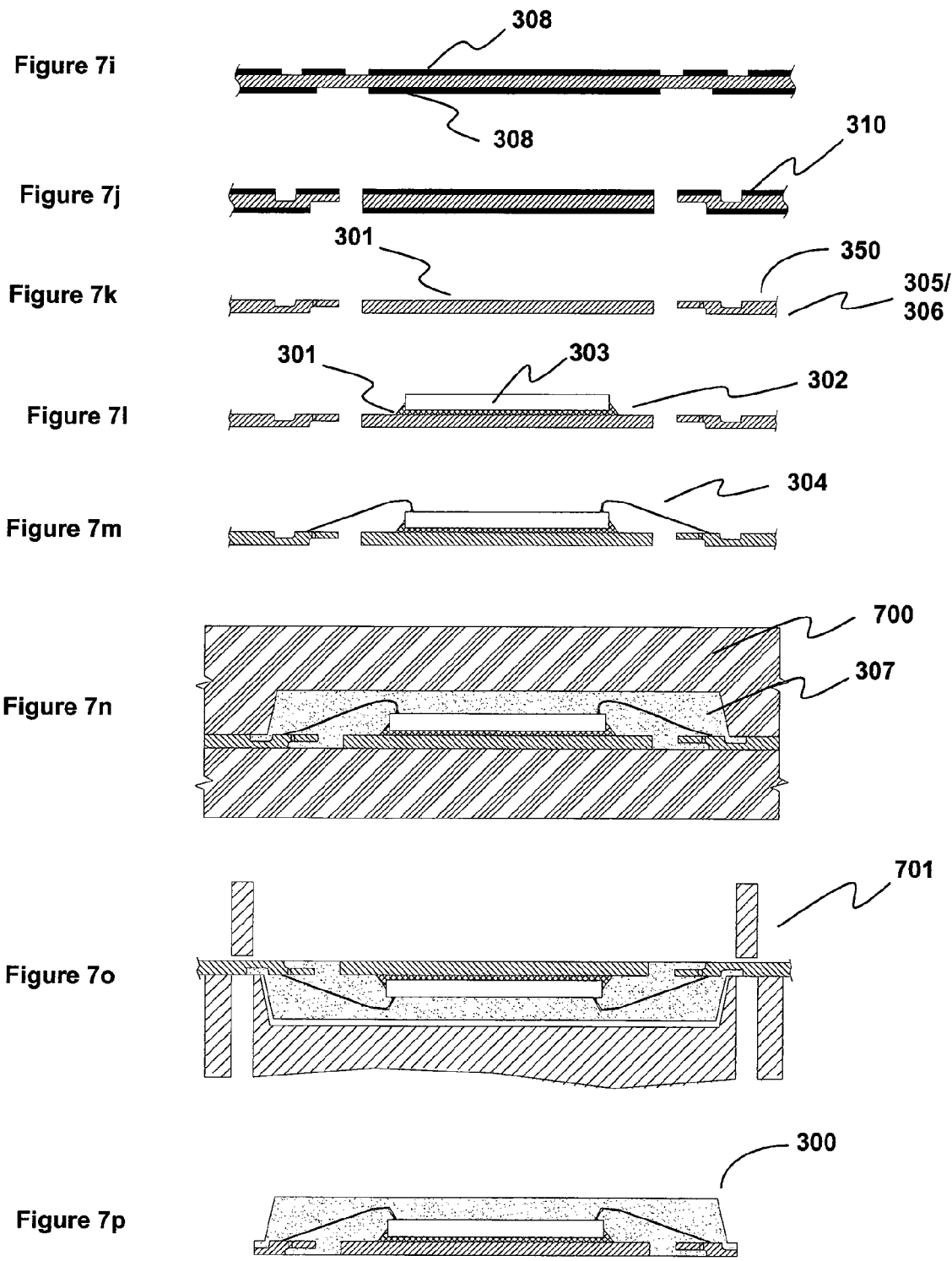

LEADFRAME ENHANCEMENT AND METHOD OF PRODUCING A MULTI-ROW SEMICONDUCTOR PACKAGE

CROSS-REFERENCE TO RELATED APPLICATIONS

This is a divisional of U.S. application Ser. No. 11/406,357 filed on Apr. 19, 2006, now U.S. Pat. No. 7,375,416, the entire contents of which are incorporated herein by reference

BACKGROUND OF THE INVENTION

1. Field of the Invention

The present invention relates to a package for a semiconductor chip and a method of forming the same. More particularly, the invention relates to a multi-row semiconductor package with an improved leadframe and a method for making said package.

2. Description of the Related Art

Semiconductor devices and integrated circuits (ICs) are made up of components, such as transistors and diodes, and elements such as resistors and capacitors, linked together by conductive connections to form one or more functional circuits. Interconnects on an IC chip serve the same function as the wiring in conventional circuits.

Once the components of an IC package have been assembled, the package is typically sealed by plastic encapsulation in order to improve the strength of the package and to provide necessary protection to the components within.

One type of package is a single sided multi row quad flat no-lead (QFN) package. See for example FIGS. 1 and 2. A multi row QFN is a type of copper leadframe based semiconductor package with more than one row of terminals at the bottom surface of the package to at least one peripheral side for the purpose of providing interconnection to external devices for example PCB.

Single sided multi row QFN packages can be singulated by two main methods, punch singulation and sawn singulation. However, both methods have several problems associated with them. For example, with punch singulation, solder bridging 101 can occur during solder plating and lead-to-lead shorting 102 can occur during package singulation. See FIGS. 1a and 1b respectively, which are top views of a portion of FIG. 1. FIG. 1b corresponds to the rectangular box drawn on top of FIG. 1. Solder bridging is a defect where solder bridged between adjacent leads. Lead-to-lead shorting is an un-wanted connection between neighboring leads caused by the inherent solder squeeze-out during package singulation. The existence of such defects in the package will affect the quality and functionality of the device.

Likewise, a single sided multi row QFN package, such as that shown in FIG. 2, formed by being sawn singulated, also has several problems associated with it. For example, adjacent leads 201 and 202 can be shorted as a result of the inherent smearing 203 of the copper material during package singulation. See FIG. 2a, which is a side view of a portion of FIG. 2 indicated by the circle in FIG. 2.

One object of the present invention is to produce a single sided multi-row package that reduces or eliminates solder bridging and lead-to-lead shorting when the package is punch singulated.

Another object of the present invention is to produce a single sided multi-row package that reduces or eliminates shorting of adjacent leads caused by smearing when the package is sawn singulated.

The invention can also act as an interlock that reduces the risk of having a separation between the mold cap and the leadframe. It also improves reliability by preventing the moisture to easily penetrate through the interface between the outer leads and mold cap.

SUMMARY OF THE INVENTION

A semiconductor package according to a first exemplary embodiment includes a plurality of first leads, each with a top outer portion removed from the lead and an outer end, and a plurality of second leads, each with a bottom outer portion removed from the lead and an outer end. The first and second leads alternate with each other along an edge of the package. Also, the outer ends of the first leads form a first row along the edge of the package and the outer ends of the second leads form a second row along the edge of the package. In this embodiment, the first and second rows are parallel to each other and an encapsulant covers at least a portion of the first and second leads.

In a second embodiment, the encapsulant covers the entire top and entire sides of the first leads, but does not cover the outer ends of the first leads. Also, the encapsulant covers a portion of the top of the second leads and the entire sides of the second leads, but does not cover the outer ends of the second leads.

In a third embodiment, the encapsulant forms a flange at an outer edge of the package.

In a fourth embodiment, the encapsulant covers the entire top and entire sides of the first and second leads, but does not cover the outer ends of the first and second leads.

A leadframe according to a first exemplary embodiment includes a plurality of first leads, each with a top outer portion removed from the lead and an outer end, and a plurality of second leads, each with a bottom outer portion removed from the lead and an outer end. The first and second leads alternate with each other along an edge of the die paddle. Also, the outer ends of the first leads form a first row along the edge of the die paddle and the outer ends of the second leads form a second row along the edge of the die paddle.

According to an exemplary embodiment of a method of manufacturing a semiconductor package with a plurality of first and second leads on a die paddle that alternate with each other and form first and second rows along an edge of the package includes attaching a bottom of the semiconductor die to the die paddle with an adhesive; connecting a plurality of wires from a top of the semiconductor die to the first and second leads; covering the semiconductor die, wires and die paddle with an encapsulant; and singulating the semiconductor package with a mechanical tool.

In other embodiments of the method, the mechanical tool can be a punch or saw.

In further embodiments of the method, the encapsulant forms a flange at an edge of said semiconductor package.

In a further embodiment of the method, the encapsulant covers at least a portion of the first and second leads.

In a further embodiment of the method, the encapsulant covers the entire top and entire sides of the first leads, but does not cover the outer ends of the first leads; and the encapsulant covers a portion of the top of the second leads and the entire sides of the second leads, but does not cover the outer ends of said second leads.

In a further embodiment of the method, the encapsulant covers the entire top and entire sides of the first and second leads, but does not cover the outer ends of the first and second leads.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIGS. 5 through 5b illustrate a leadframe design according to an exemplary embodiment of the present invention and the leadframe being used for punch singulated and sawn singulated packages;

FIGS. 6 and 6a illustrate packages that use the leadframe shown in FIGS. 5 through 5b;

FIGS. 7a through 7f illustrate a method of manufacturing the package shown in FIG. 5b;

FIGS. 7g through 7p illustrate a method of manufacturing the package shown in FIG. 5a;

Figure 1:
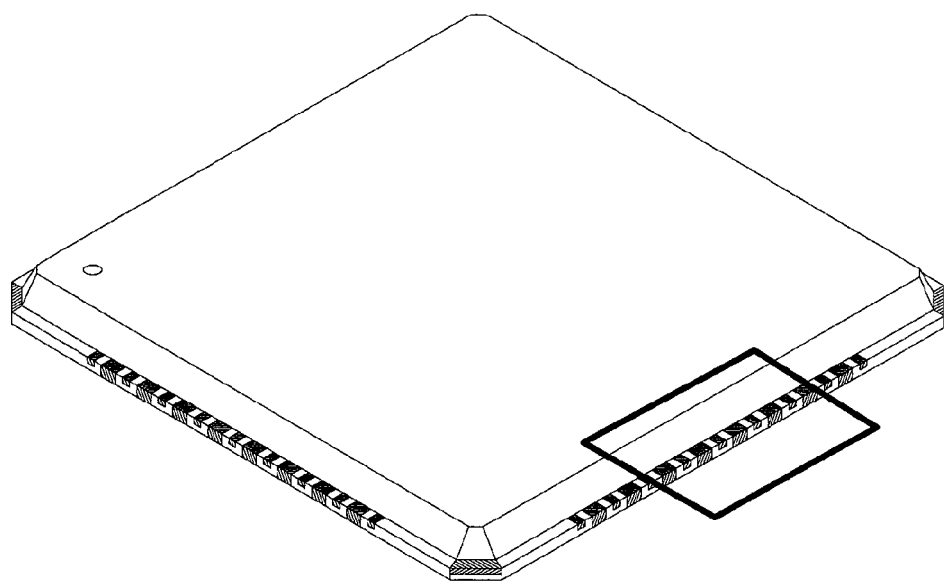
FIGS. 1 through 1b illustrate a single sided multi-row QFN package and solder bridging and lead-to-lead shorting that can occur during punch singulation.

DETAILED DESCRIPTION OF THE ILLUSTRATIVE NON-LIMITING EMBODIMENTS OF THE INVENTION

Hereinafter, the present invention will be described in detail by way of exemplary embodiments with reference to the drawings. The described exemplary embodiments are intended to assist in the understanding of the invention, and are not intended to limit the scope of the invention in any way. Throughout the drawings for explaining the exemplary embodiments, those components having identical functions carry the same reference numerals for which duplicate explanations will be omitted.

Figure 3:
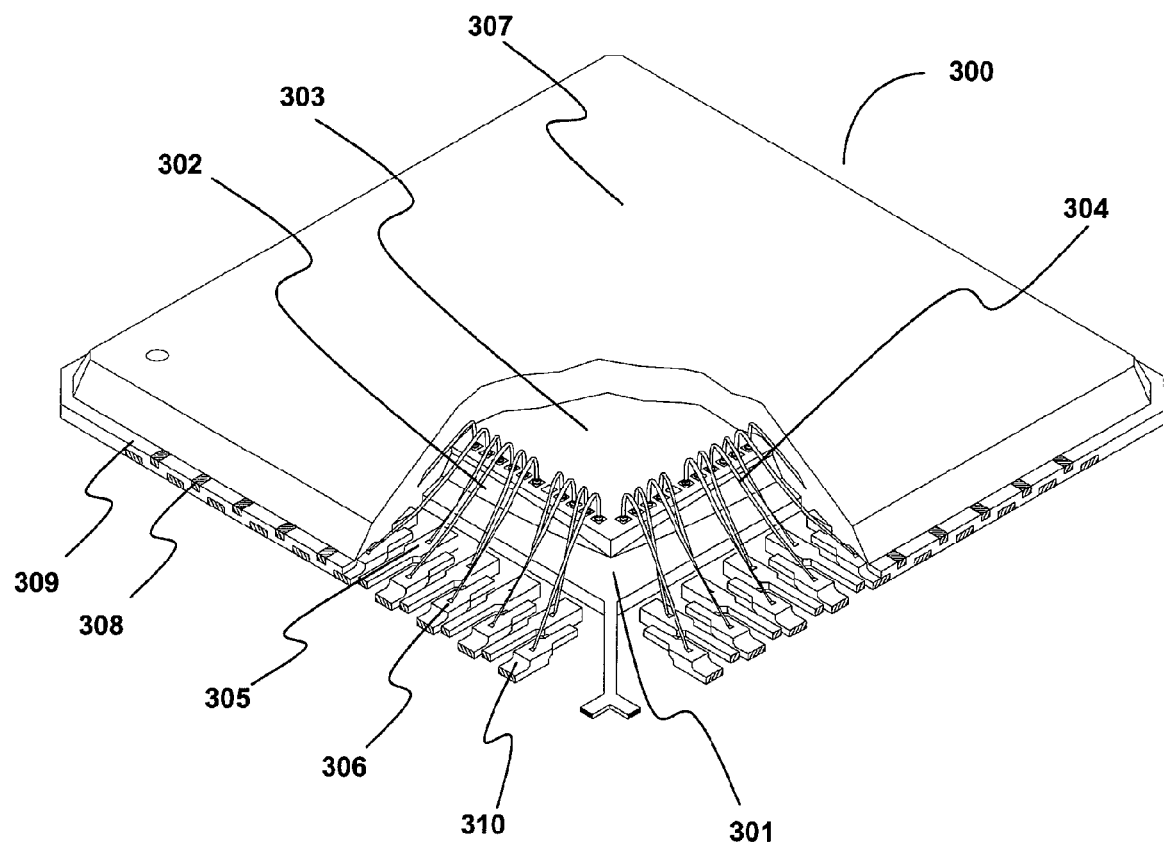
FIGS. 3 through 3b illustrate a single sided integrated circuit according to an exemplary embodiment of the present invention.

The present invention provides solutions to prevent some of the problems described above. An exemplary embodiment of a package illustrated in FIG. 3 is a single sided, multi row, integrated circuit that is composed various components. A package 300 is formed by attaching a chip 303 onto a die paddle 301 using a conductive or non-conductive epoxy or an adhesive film 302. Chip 303 is connected to external leads 305 and 306 using wires 304. The layout of the wire connections to the leads is determined by the circuitry and application of the device. A multi-row lead can consist of two or more rows of leads. As an example only, package 300 contains two rows of lead; an outer row comprising leads 306 and an inner row comprising leads 305. An encapsulation 307 protects the entire circuitry and the components inside the package. The outline of the package is defined by the size and shape of the encapsulation mold. Part of the package outline for a punch singulated package is a flange 309, which is located on the perimeter of the package. The flange exposes a small portion of the leads on the top side.

Figure 3A:
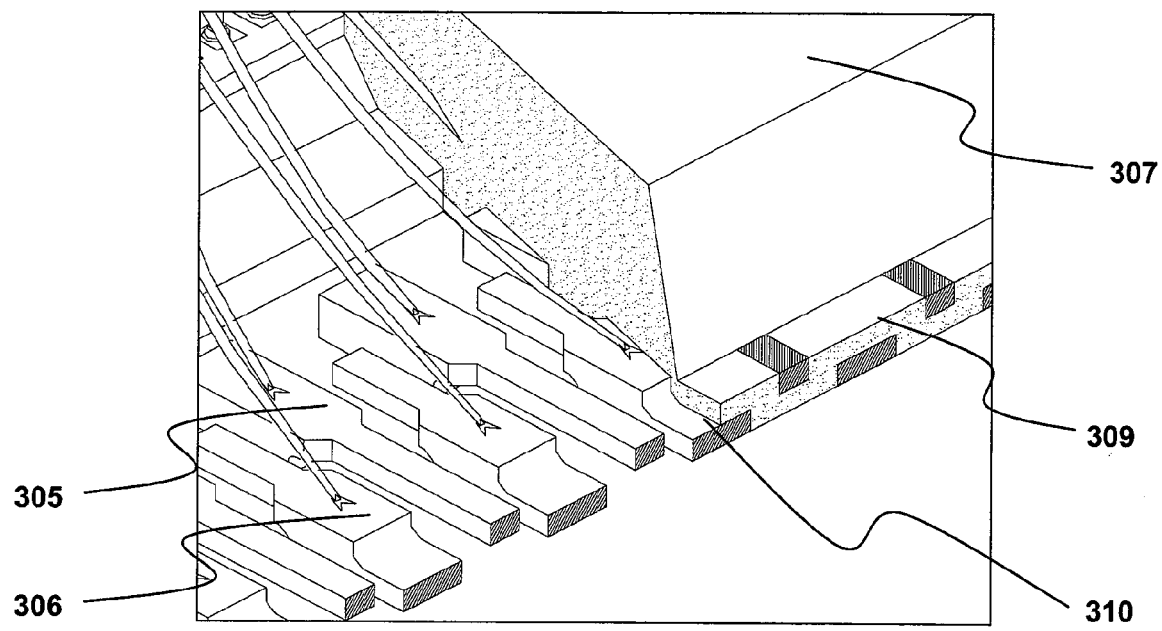

One focus of the present invention lies on the design of outer lead 306, in which a top outer portion 310 of lead 306 is partially etched or cut out so that it will be covered with an encapsulation material during molding or encapsulation. FIG. 3a shows a magnified view of a portion of FIG. 3 that illustrates how the embodiment addresses some of the aforementioned problems. For example, FIG. 3a shows the etched top outer portion 310 of lead 306 and flange 309.

Figure 1A:
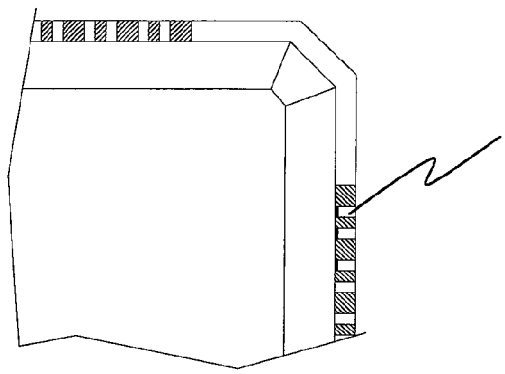
Figure 1B:
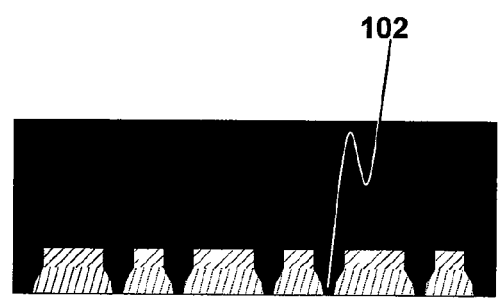
Figure 3B:
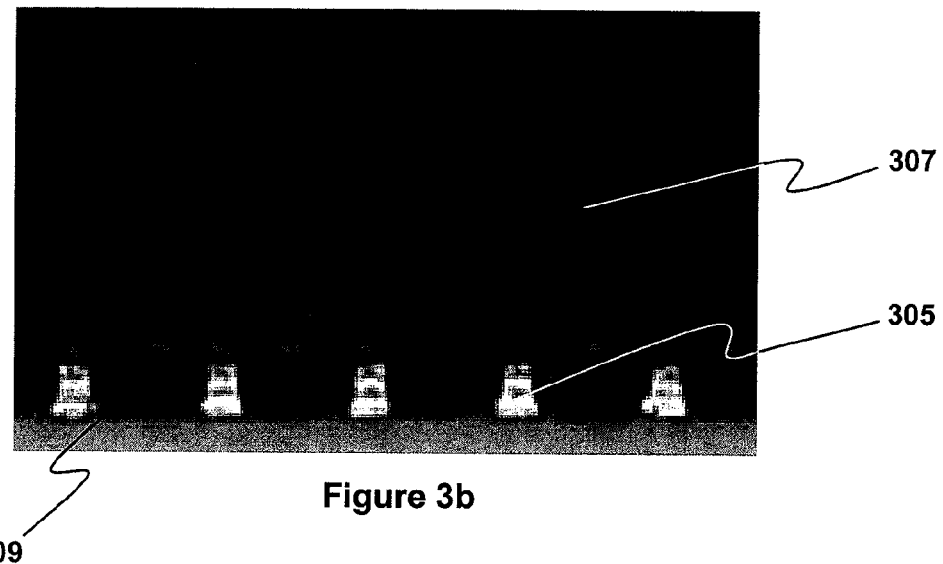

FIG. 3b is a photograph of an exemplary embodiment of a punch singulated multi-row QFN package, where only the outside portion of the inner leads 305 are exposed on top side of flange 309. This reduces or eliminates the risk of lead-to-lead shorting shown in FIG. 1a during singulation and solder bridging shown in FIG. 1b.

Figure 2:
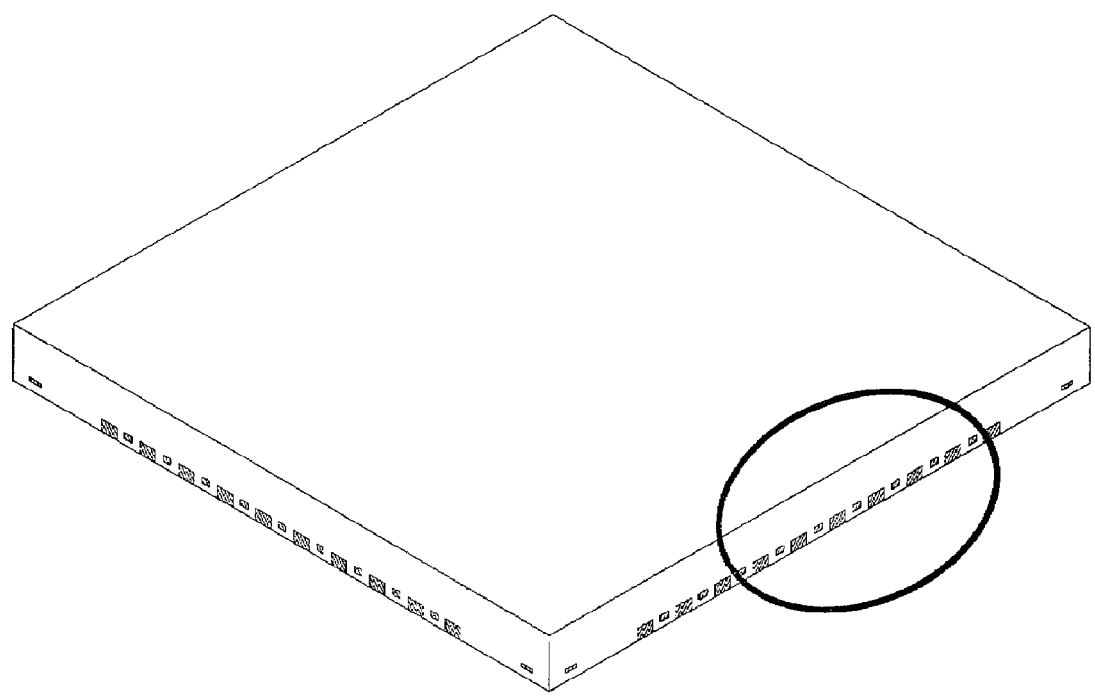
FIGS. 2 and 2a illustrate a single sided multi-row QFN package and shorting of adjacent leads that can occur during sawn singulation.
Figure 2A:
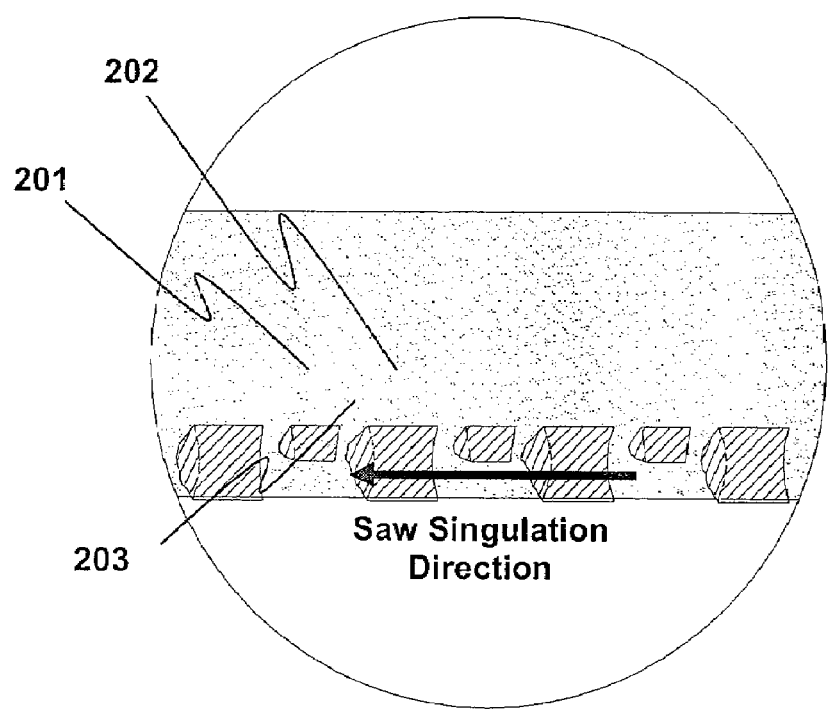
Figure 4:
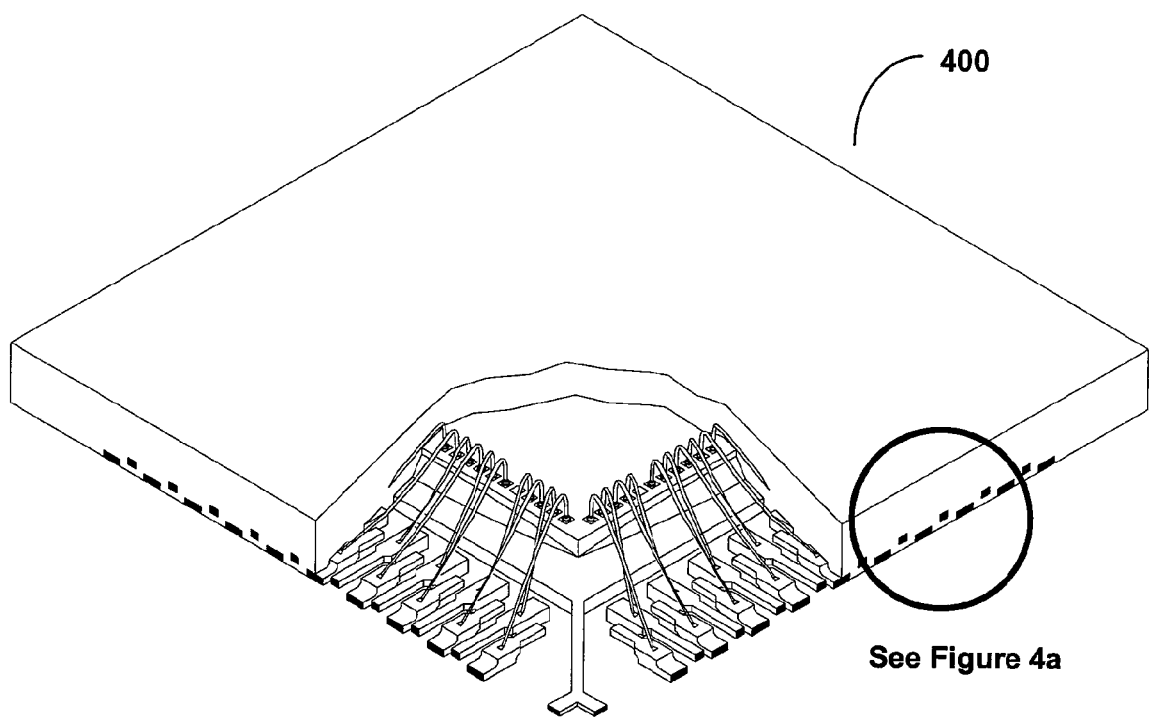
FIGS. 4 through 4b illustrate a single sided integrated circuit according to another exemplary embodiment of the present invention.
Figure 4A:
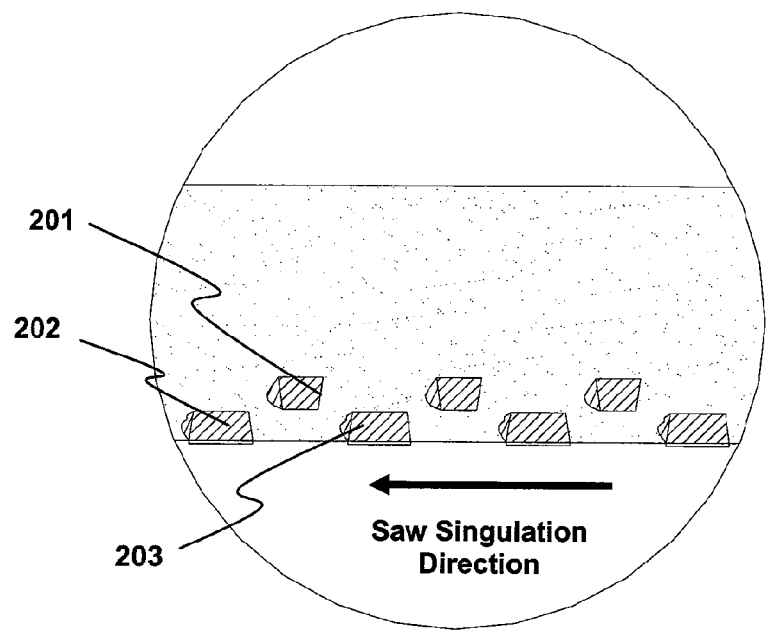
Figure 4B:
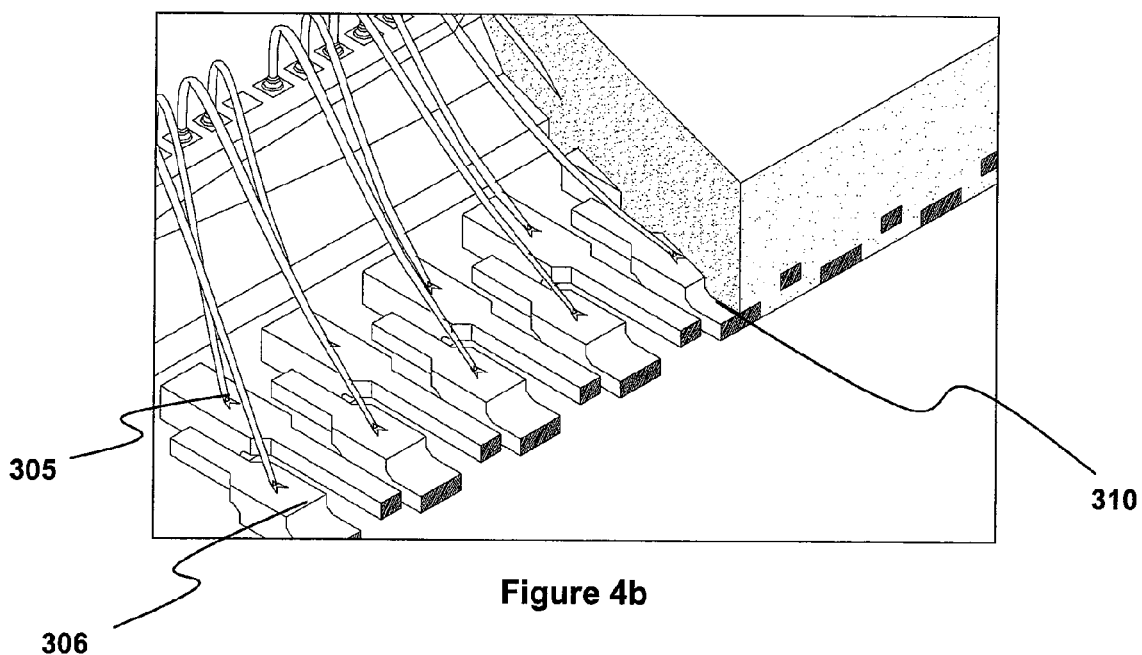

FIG. 4 is an exemplary embodiment of a saw singulated, one sided, multi-row integrated circuit package. This package is similar to the punch singulated package described above and in FIGS. 3 through 3b. One difference from the punch type is the package outline. For example, package 400 does not contain any flange (such as flange 309 in FIG. 3). Solder bridging during solder plating is not an issue with this type of package; however, the risk of lead-to-lead shorting during package singulation still exists. Lead-to-lead shorting failures are illustrated in FIG. 2a. The embodiment of FIG. 4 reduces or eliminates lead-to-lead shorting by preventing the adjacent leads from shorting even with the existence of smear on the leads induced by saw singulation process. FIGS. 4 through 4b show how lead-to-lead shorting is prevented. As can be seen, because there is an upper and lower rows of leads (in this example), adjacent leads are not directly next to each other. Rather, they alternate as upper and lower leads.

FIG. 5 illustrates a typical leadframe design for multi-row QFN forming the die paddle 301, with a plurality of leads; inner row leads 305 and outer row leads 306. The layout, or pattern of the frame, can be formed by, for example, mechanical or chemical processes. The process of making such a leadframe is know to one of skill in the art and thus, will not be discussed in this patent description. One example of the present invention, however, is the inclusion of a feature on the outer lead 306. This feature can be formed by partially etching a portion along the top side of the lead 306 to form a cavity 310. FIG. 5 also shows an inner leads 305 formed by partially etching along the bottom side of the lead 305 for form a cavity.

FIGS. 5a and 5b illustrate cross section views of the frame with a chip attached onto it and encapsulated. FIG. 5a shows a punch singulated embodiment and FIG. 5b shows a sawn singulated embodiment.

Figure 6A:
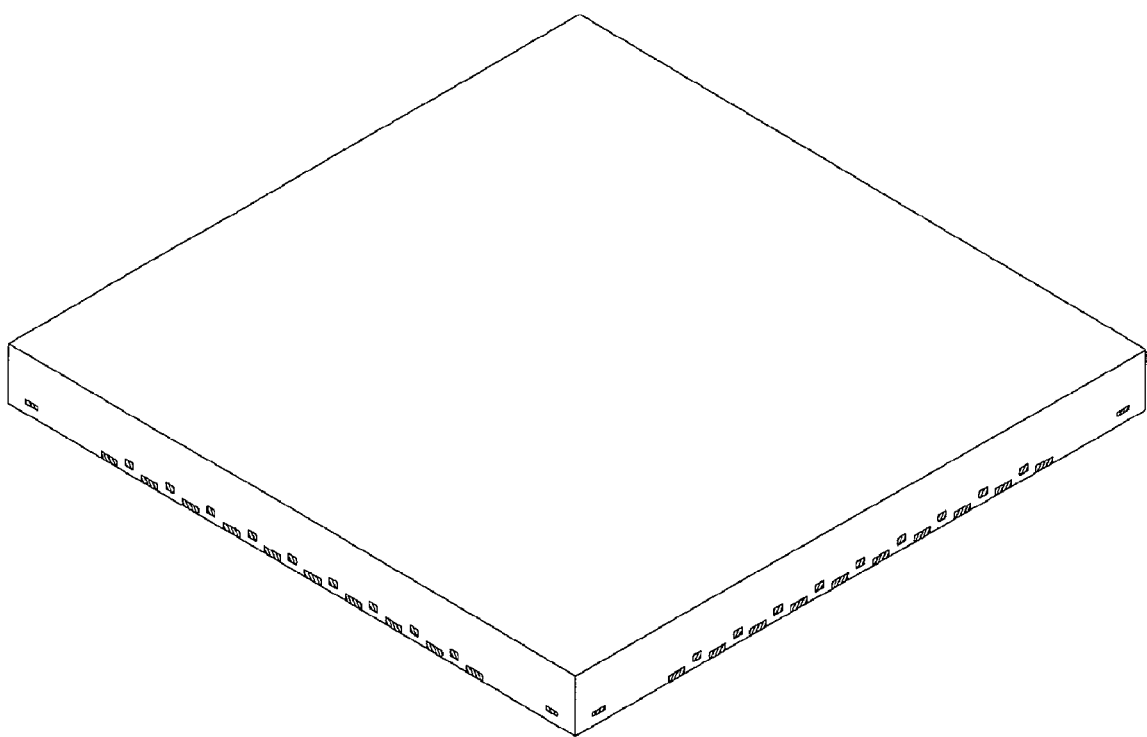

FIGS. 6 and 6a show the exterior of exemplary embodiments of the packages using an enhanced frame of the present invention.

FIGS. 7a through 7l illustrate an exemplary method of manufacturing the embodiments illustrated in FIGS. 5a and 5b.

First, an exemplary method of manufacturing the embodiment in FIG. 5b will be described with the cross-section views in FIGS. 7a through 7h. During the manufacturing of leadframe 350 (shown in FIG. 7c), the leadframe raw material is applied with mask 308 (FIG. 7a) which defines the layout of the leadframe. During etching process, the exposed areas will be etched out leaving only the covered or masked portion of the copper. At the same stage of leadframe manufacturing, the half etched cavity 310 on outer lead 306 is also formed (FIG. 7b). FIG. 7c shows the die paddle 301 and lead frames 305/306. In FIG. 7d, an integrated circuit chip 303 is attached to die paddle 301 with an adhesive component 302. Adhesive 302 includes any types of conductive epoxy with an addition of silver filler or non-conductive epoxy. In FIG. 7e, a wire 304 is used to create the interconnections between the integrated circuit chip 303 and the leads 305 and 306. In FIG. 7f, the assembled parts are encapsulated by using a typical mold 700. The encapsulant 307 is filled in the mold 700 and provides protection to the components. FIG. 7g shows the package being sawn singulated with a typical mechanical cutting tool 701. The final integrated circuit package is shown in FIG. 7h.

Likewise an exemplary method of manufacturing the embodiment in FIG. 5a will be described with the cross-section views in FIGS. 7i through 7p. During the manufacturing of leadframe 350 (shown in FIG. 7k), the leadframe raw material is applied with mask 308 (FIG. 7i) which defines the layout of the leadframe. During etching process, the exposed areas will be etched out leaving only the covered or masked portion of the copper. At the same stage of leadframe manufacturing, the half etched cavity 310 on outer lead 306 is also formed (FIG. 7j). FIG. 7k shows the die paddle 301 and lead frames 305/306. In FIG. 7l, an integrated circuit chip 303 is attached to die paddle 301 with an adhesive component 302. Adhesive 302 includes any types of conductive epoxy with an addition of silver filler or non-conductive epoxy. In FIG. 7m, a wire 304 is used to create the interconnections between the integrated circuit chip 303 and the leads 305 and 306. In FIG. 7n, the assembled parts are encapsulated by using a typical mold 700. The encapsulant 307 is filled in the mold 700 and provides protection to the components. FIG. 7o shows the package being punch singulated with a typical mechanical cutting tool 701. The final integrated circuit package is shown in FIG. 7p.

Figure 8:
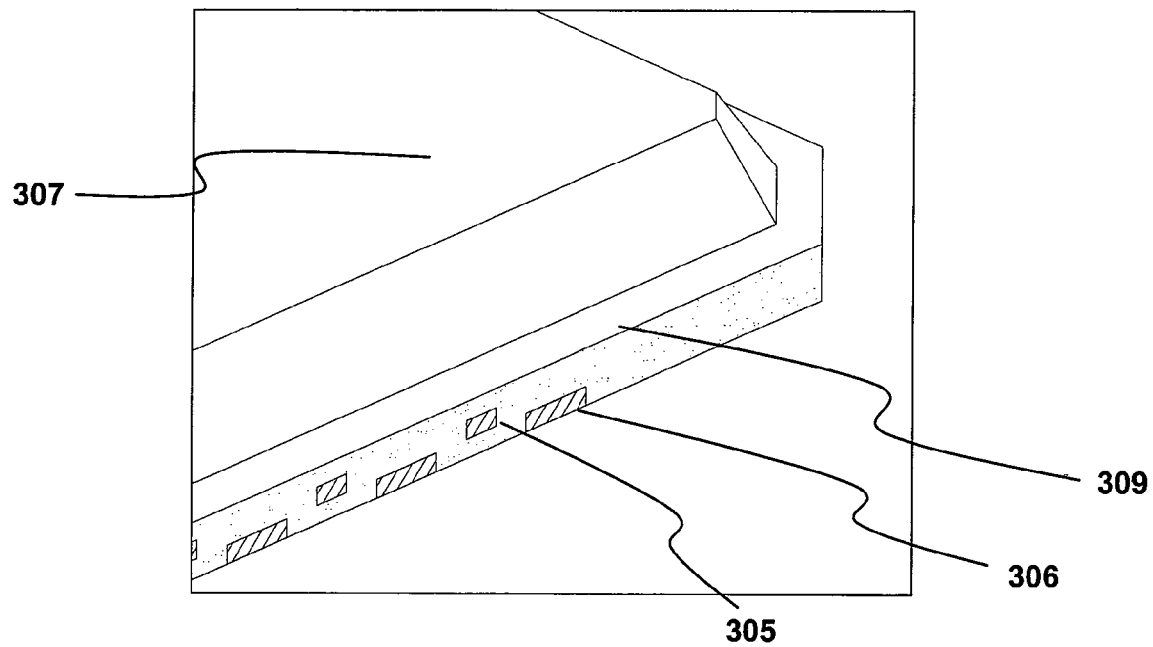
FIGS. 8 and 8a illustrate another exemplary embodiment of a package that reduces or eliminates solder bridging and lead-to-lead shorting.
Figure 8A:
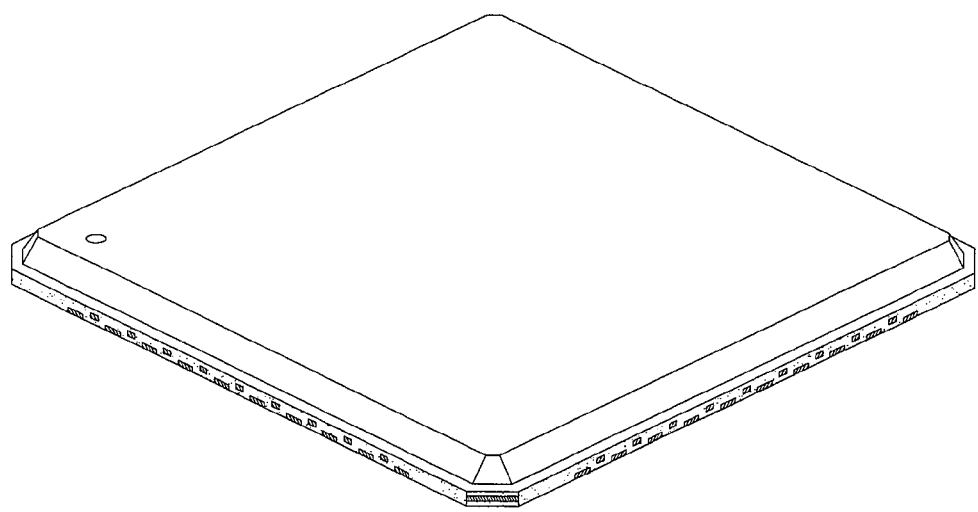

FIG. 8 shows an alternative way of preventing solder bridging and lead-to-lead shorting for punch singulated multi-row QFN packages. In this exemplary embodiment, the top of flange 309 is over molded to conceal both the inner leads 305 and outer leads 306. FIG. 8a shows the eventual structure of the package with the over molded flange.

Figure 9:
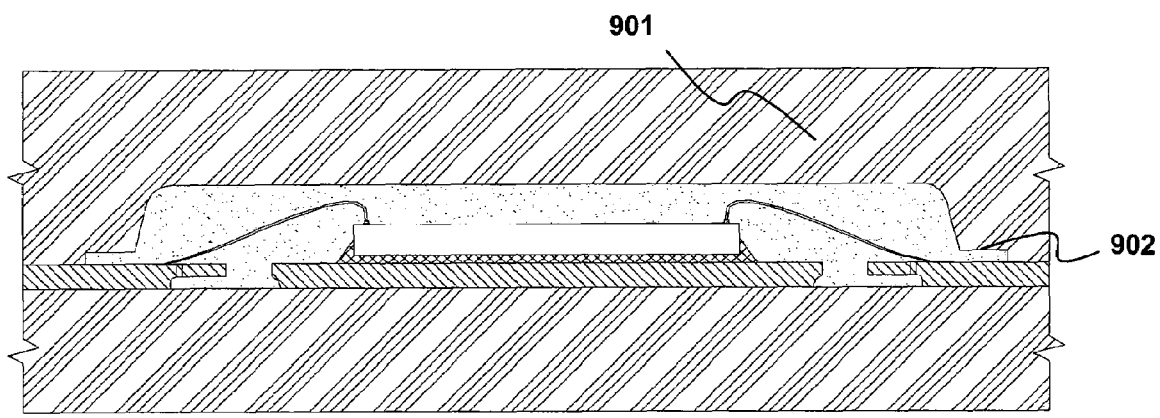
FIGS. 9 through 9d illustrate a method of encapsulating a package that has a flange.
Figure 9A:
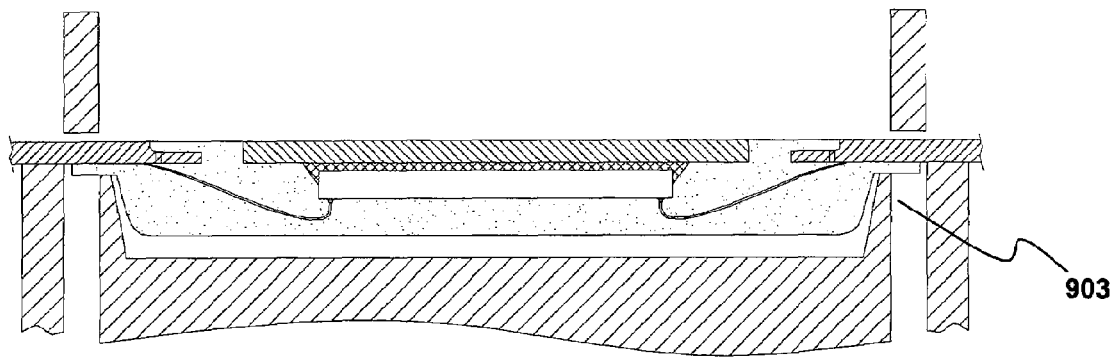

FIG. 9 illustrates how the top portion of the flange is encapsulated. Concealing the leads 305 and 306 on top of the flange 309 may be done by the including a step, or extension 902, in the mold cavity 901. The assembly process step is similar to the one described in FIGS. 7g through 7l. The package singulation process shown in this FIG. 9a is similar to the one illustrated in FIG. 7k except that the cutting tool 903 is designed to handle the package with over molded flange. One of skill in the art would be able to design an appropriate cutting tool; therefore, the design of the cutting tool 903 is not discussed in the specification.

Figure 9B:
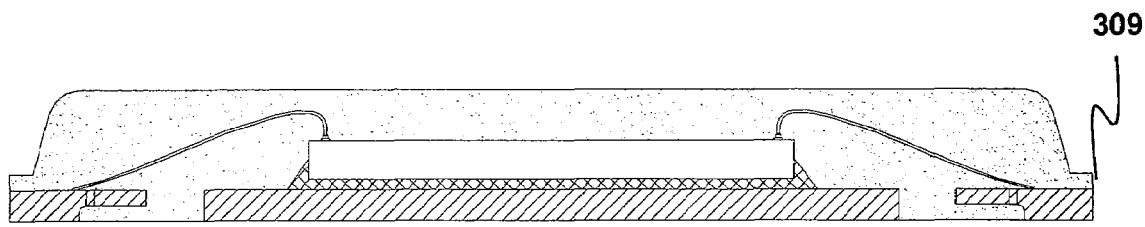
Figure 9C:
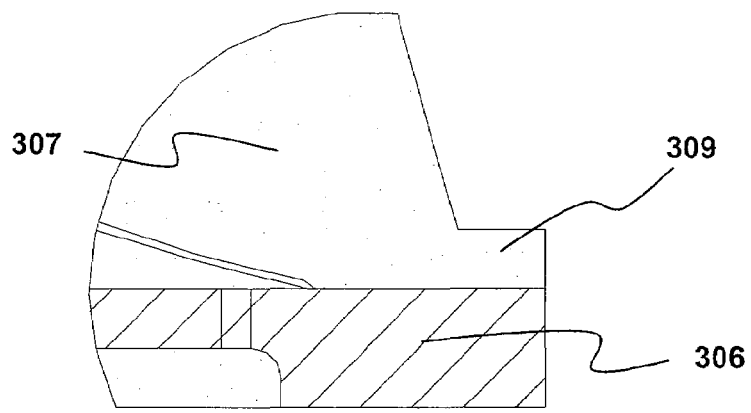
Figure 9D:
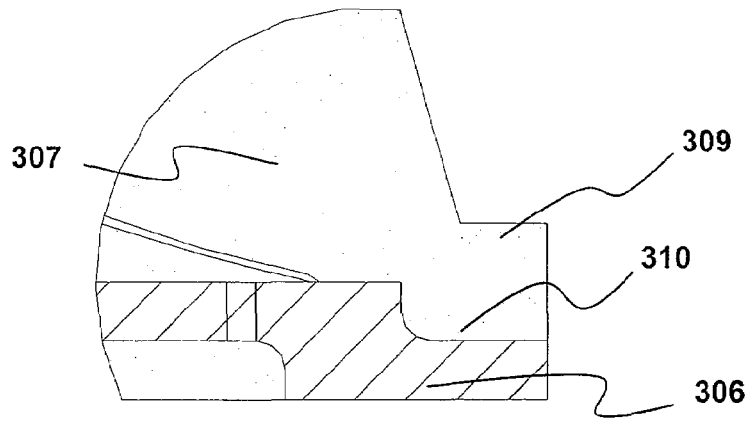

FIG. 9b is a cross sectional view of a one-sided integrated circuit package with an over molded or encapsulated flange 309. FIG. 9c shows a flange using a frame without the half etch feature 310 on the outer lead 306. Whereas, FIG. 9d shows a package encapsulated using mold 901 with a step 310 and a frame with half etch feature 310 on the lead 306.

Figure 10:
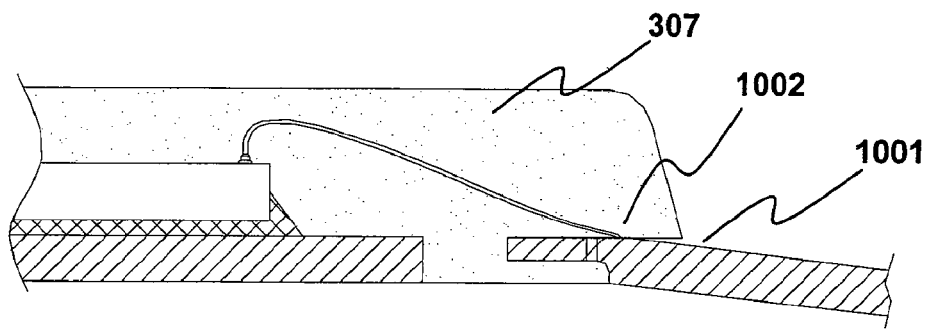
FIGS. 10-10c illustrate a problem associated with a package without a flange or enhanced leadframe and how the problem has been addressed by packages with a flange or enhanced leadframe.
Figure 10A:
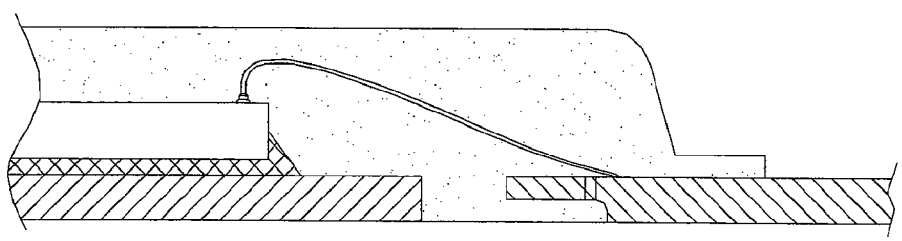
Figure 10B:
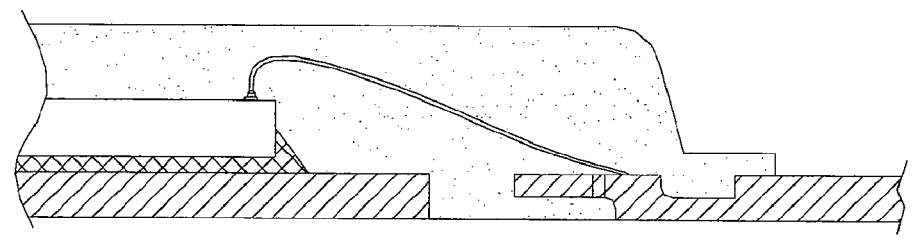
Figure 10C:
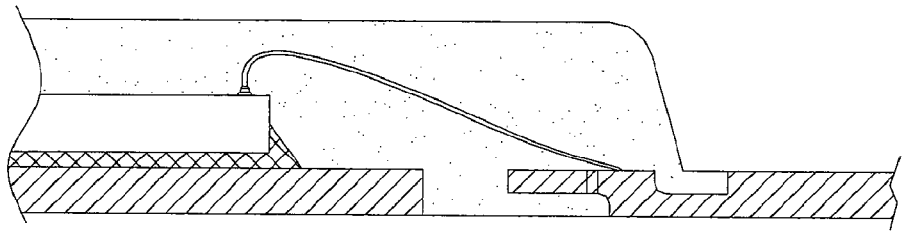

Another benefit of the invention is enhancement of the integrity of the package. FIGS. 10 through 10 illustrate this enhanced integrity. FIG. 10 shows the cross sectional view of a one sided package, without the enhanced feature 310 on the lead 306. Such a structure is susceptible to separation between the encapsulation material 307 and the lead creating cracks or micro-cracks 1001 that later serves as passage for moisture to enter the package. This causes the unit or device to fail when subjected to mechanical or thermal stress. The initiation of cracks or micro-cracks 1001 can also propagate towards the bond finger 1002 causing wire 304 to break. FIGS. 10a through 10c show how the cracking problem can be prevented by using a frame with enhanced feature 310 on the lead 306 and/or by using mold cavity 901 with a step 901.

It should be emphasized that the above-described embodiments of the present invention are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A method of manufacturing a semiconductor package with a plurality of first and second leads on a die paddle that alternate with each other and form first and second rows along an edge of said package comprising:
   attaching a bottom of said semiconductor die to said die paddle with an adhesive;
   connecting a plurality of wires from a top of said semiconductor die to said first and second leads;
   covering said semiconductor die, wires and die paddle with an encapsulant; and
   singulating said semiconductor package with a mechanical tool.

2. The method of claim 1 wherein said mechanical tool is a punch.

3. The method of claim 1 wherein said mechanical tool is a saw.

4. The method of claim 1 wherein said encapsulant forms a flange at an edge of said semiconductor package.

5. The method of claim 4 wherein said encapsulant covers at least a portion of said first and second leads.

6. The method of claim 5 wherein said encapsulant covers the entire top and entire sides of said first leads, but does not cover the outer ends of said first leads; and
   wherein said encapsulant covers a portion of the top of said second leads and the entire sides of said second leads, but does not cover the outer ends of said second leads.

7. The method of claim 4 wherein said encapsulant covers the entire top and entire sides of said first and second leads, but does not cover the outer ends of said first and second leads.

* * * * *